United States Patent [19]
Gillig

[11] Patent Number: 5,375,258
[45] Date of Patent: Dec. 20, 1994

[54] CIRCUIT FOR GENERATING SIGNALS IN PHASE QUADRATURE AND ASSOCIATED METHOD THEREFOR

[75] Inventor: Steven F. Gillig, Roselle, Ill.

[73] Assignee: Motorola, Inc., Schaumburg, Ill.

[21] Appl. No.: 986,206

[22] Filed: Dec. 7, 1992

[51] Int. Cl.$^5$ .................... H04B 1/52; H04B 1/58
[52] U.S. Cl. ........................... 455/87; 455/208; 455/316; 455/319
[58] Field of Search ............ 455/209, 207, 208, 318, 455/319, 317, 316, 118, 86, 87; 375/39, 94, 81; 332/127

[56] References Cited

U.S. PATENT DOCUMENTS

| | | | |
|---|---|---|---|
| 4,903,331 | 2/1990 | Kasperkovitz | 455/207 |
| 4,959,557 | 9/1990 | Miller | 307/265 |
| 5,097,230 | 3/1992 | Lantzenhiser | 332/127 |

FOREIGN PATENT DOCUMENTS

3815055  11/1989  Germany .

*Primary Examiner*—Edward F. Urban
*Assistant Examiner*—Mary M. Lin
*Attorney, Agent, or Firm*—Randall S. Vaas

[57] ABSTRACT

A quadrant generator for generating a pair of pulse trains maintained in perfect phase quadrant with one another. The quadrature generator includes a feedback control loop for altering the duty cycle of an oscillating signal applied to a master-slave flip-flop pair configured to generate a pair of pulse trains maintained in a relative phase relationship. The feedback control loop controls the duty cycle of the oscillating signal applied to the master-slave flip-flop pair which, in turn, is determinative of the phase relationship between the pulse train pair generated by the master-slave flip-flop pair. When the pulse trains generated by the flip-flop pair are beyond phase quadrature, a control signal generated by the feedback control loop alters the duty cycle of the oscillating signal applied to the flip-flop pair to alter the phase relationship between the pulse trains of the pulse train pair.

21 Claims, 6 Drawing Sheets

CIRCUIT FOR GENERATING SIGNALS IN PHASE QUADRATURE AND ASSOCIATED METHOD THEREFOR

BACKGROUND OF THE INVENTION

The present invention relates generally to quadrature generators and, more particularly, to a quadrature generator which generates a set of signals in perfect phase quadrature with one another.

A communication system is comprised, at a minimum, of a transmitter and a receiver interconnected by a transmission channel. A communication signal is transmitted by the transmitter upon the transmission channel to be received by the receiver. A radio communication system is a communication system in which the transmission channel comprises a radio frequency channel defined by a range of frequencies of the electromagnetic frequency spectrum. A transmitter operative in a radio communication system must convert the communication signal into a form suitable for transmission upon the radio-frequency channel.

Conversion of the communication signal into the form suitable for transmission upon the radio-frequency channel is effectuated by a process referred to as modulation. In such a process, the communication signal is impressed upon an electromagnetic wave. The electromagnetic wave is commonly referred to as a "carrier signal." The resultant signal, once modulated by the communication signal, is commonly referred to as a modulated carrier signal. The transmitter includes circuitry operative to perform such a modulation process.

Because the modulated carrier signal may be transmitted through free space over large distances, radio communication systems are widely utilized to effectuate communication between a transmitter and a remotely-positioned receiver.

The receiver of the radio communication system which receives the modulated carrier signal contains circuitry analogous to, but operative in a manner reverse with that of, the circuitry of the transmitter and is operative to perform a process referred to as demodulation.

Numerous modulated carrier signals may be simultaneously transmitted as long as the signals are transmitted upon differing radio frequency channels of the electromagnetic frequency spectrum. Regulatory bodies have divided portions of the electromagnetic frequency spectrum into frequency bands and have regulated transmission of the modulated carrier signals upon various ones of the frequency bands. (Frequency bands are further divided into channels, and such channels form the radio-frequency channels of a radio communication system.)

A two-way radio communication system is a radio communication system, similar to the radio communication system above-described, but which permits both transmission of a modulated carrier signal from a location and reception at such location of a modulated carrier signal. Each location of such a two-radio communication system contains both a transmitter and a receiver. The transmitter and the receiver positioned at a single location typically comprise a unit referred to as a radio transceiver or, more simply, a transceiver.

A two-way, radio communication system which permits alternate transmission and reception of modulated carrier signals is referred to as a simplex system. A two-way radio communication system which permits simultaneous transmission and reception of communication signals is referred to as a duplex system.

A cellular communication system is one type of two-way radio communication system in which communication is permitted with a radio transceiver positioned at any location within a geographic area encompassed by the cellular, communication system.

A cellular, communication system is created by positioning a plurality of fixed-site radio transceivers, referred to as base stations, at spaced-apart locations throughout a geographic area. The base stations are connected to a conventional, wireline telephonic network. Associated with each base station of the plurality of base stations is a portion of the geographic area encompassed by the cellular, communication system. Such portions are referred to as cells. Each of the plurality of cells is defined by one of the base stations of the plurality of base stations, and the plurality of cells together define the coverage area of the cellular, communication system.

A radio transceiver, referred to in a cellular communication system as a cellular radiotelephone or, more simply, a cellular phone, positioned at any location within the coverage area of the cellular communication system, is able to communicate with a user of the conventional, wireline, telephonic network by way of a base station. Modulated carrier signals generated by the radiotelephone are transmitted to a base station, and modulated carrier signals generated by the base station are transmitted to the radiotelephone, thereby to effectuate two-way communication therebetween. (A signal received by a base station is then transmitted to a desired location of a conventional, wireline network by conventional telephony techniques. And, signals generated at a location of the wireline network are transmitted to a base station by conventional telephony techniques, thereafter to be transmitted to the radiotelephone by the base station.)

Increased usage of cellular, communication systems has resulted, in some instances, in the full utilization of every available transmission channel of the frequency band allocated for cellular radiotelephone communication. As a result, various ideas have been proposed to utilize more efficiently the frequency band allocated for radiotelephone communications. By more efficiently utilizing the frequency band allocated for radiotelephone communication, the transmission capacity of an existing, cellular communication system may be increased.

The transmission capacity of the cellular, communication system may be increased by minimizing the modulation spectrum of the modulated signal transmitted by a transmitter to permit thereby a greater number of modulated signals to be transmitted simultaneously. Additionally, by minimizing the amount of time required to transmit a modulated signal, a greater number of modulated signals may be sequentially transmitted.

By converting a communication signal into discrete form prior to transmission thereof, the resultant, modulated signal is typically of a smaller modulation spectrum than a corresponding modulated signal comprised of a communication signal that has not been converted into discrete form. Additionally, when the communication signal is converted into discrete form prior to modulation thereof, the resultant, modulated signal may be transmitted in short bursts, and more than one modulated signal may be transmitted sequentially upon a single transmission channel.

Converting the communication signal into discrete form is typically effectuated by an encoding technique, and apparatus which effectuates such conversion is typically referred to as an encoder. An encoded signal generated as a result of an encoding technique may, for example, be in the form of a discrete binary data stream. The elements (i.e., bits) of the discrete binary data stream represent various characteristics of the information signal.

Quadrature amplitude modulation (QAM) is a modulation technique which may be advantageously utilized to transmit efficiently a communication signal encoded into discrete form. More particularly, one particular QAM modulation technique is a $\pi/4$-DQPSK (for differential quadrature phase shift keying) modulation technique. Such modulation technique has been selected as a modulation standard for several cellular, communication systems. In a $\pi/4$-DQPSK modulation technique, the binary data stream into which the communication signal is encoded is separated into bit pairs. Such bit pairs are utilized to cause phase shifts of a carrier wave in increments of plus or minus $\pi/4$ radians or plus or minus $3\pi/4$ radians according to the values of individual bit pairs of the encoded signal.

Such phase shifts are effectuated by applying the binary data stream comprised of the bit pairs to a pair of mixer circuits. A sine component of a carrier signal is applied to an input of a first of the mixer circuits, and a cosine component of a carrier signal is applied to an input of a second mixer circuit of the pair of mixer circuits. (The sine and cosine components of the carrier signal are in a relative phase relationship of ninety degrees with one another.)

A quadrature generator is utilized to apply the sine and cosine components of the carrier signal to the first and second mixer circuits of the pair of mixer circuits, respectively.

A quadrature generator may be formed of a resistor-capacitor pair in which the value of at least either the resistor or the capacitor is variable as a function of voltage. The frequencies of oscillation of the signals generated by a quadrature generator are dependent upon the values of the resistor-capacitor pair, and, as the values of the resistor and capacitor of the resistor-capacitor pair are functions of voltage, the range of frequencies of the signals generated by the quadrature generator is dependent upon voltage levels of frequency-controlling voltages applied to the quadrature generator.

As the circuitry of apparatus, such as a radiotelephone utilized in a cellular, communication system, of which the quadrature generators form a portion, are constructed to be operated at ever-lower voltage levels, the range of values of which the resistor or capacitor of the resistor-capacitor pair can take is increasingly limited. The range of frequencies of signals generated by a quadrature generator so constructed is increasingly limited.

A quadrature generator may alternately be constructed of a flip-flop pair arranged such that the outputs of each flip-flop of the flip-flop pair are applied to inputs of the other flip-flop of the flip-flop pair. A clock signal is also applied to each of the flip-flops of the flip-flop pair wherein the clock signal is inverted prior to application to one of the flip-flops. Outputs of the respective flip-flops of the flip-flop pair are in a ninety degree phase relationship (and, hence, are in phase quadrature) when the duty cycle of the clock signal applied to the flip-flops is of a fifty-fifty duty cycle. That is, the clock signal must be of a high logic level for exactly half of the period of the clock signal and be of a low logic level for exactly half of the period of the clock signal.

Any variation in the duty cycle of the clock signal causes the signal output by the respective ones of the flip-flop pair to be out of phase quadrature (i.e., in a phase relationship other than a ninety degree phase relationship) with one another. When the duty cycle of the clock signal is significantly different than a fifty-fifty duty cycle, the signals generated by the flip-flop pair are significantly out of phase quadrature.

Clock oscillators which generate clock signals will not in general produce clock signals exactly of the fifty-fifty duty cycle. Additionally, the duty cycle of the clock signal generated by a clock oscillator may vary as the clock oscillator ages or as a result of circuit placement of the clock oscillator.

What is needed, therefore, is circuitry operative to generate reliably a pair of signals in perfect phase quadrature with one another.

SUMMARY OF THE INVENTION

The present invention, accordingly, advantageously provides a circuit for generating a pair of signals in perfect phase quadrature with one another.

The present invention further advantageously provides receiver and transmitter circuitry including a quadrature generator for generating signals in phase quadrature with one another.

The present invention contains further advantages and features, the details of which will be better understood when reading the detailed description of the preferred embodiments hereinbelow.

In accordance with the present invention, therefore, a circuit for generating a set of signals in phase quadrature with one another is disclosed. A clock signal defined by a clock signal duty cycle is generated. Responsive to values of the clock signal, an oscillating signal of an oscillating signal duty cycle is generated. A pulse train-pair comprised of a first pulse train and a second pulse train wherein the first pulse train and the second pulse train are of similar frequencies but offset in phase relative to one another is generated responsive to the oscillating signal. Relative phase differences between the phases of the first and second pulse trains are determined and a control signal representative of the relative phase differences is generated. The control signal is utilized in a feedback control loop arrangement to alter the oscillating signal duty cycle of the oscillating signal when the first and second pulse trains are beyond phase quadrature with one another to maintain the first and second pulse trains in phase quadrature with one another.

BRIEF DESCRIPTION OF THE DRAWINGS

The present invention will be better understood when read in light of the accompanying drawings in which.

DESCRIPTION OF THE PREFERRED EMBODIMENTS

Figure 1:
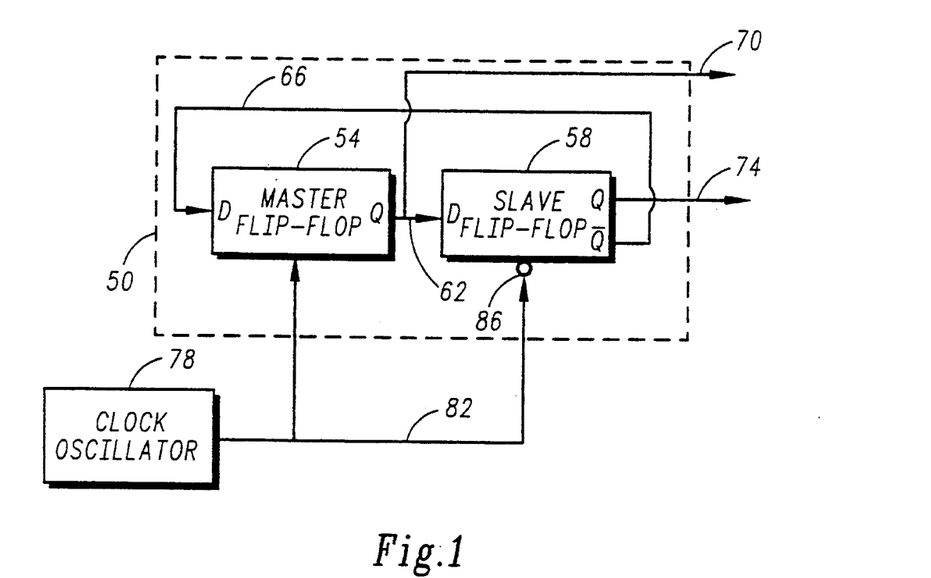
FIG. 1 is a block diagram of a circuit including a flip-flop pair which forms a portion of the circuit of a preferred embodiment of the present invention.

Turning first to the block diagram of FIG. 1, flip-flop pair 50, comprised of elements shown within the block shown in hatch, which forms a portion of the quadrature generator of the preferred embodiments of the present invention is shown. Flip-flop pair 50 is comprised of first and second flip-flops, here master flip-flop 54 and slave flip-flop 58. An output of master flip-flop 54 is applied on line 62 to an input of slave flip-flop 58. And, an inverted output of slave flip-flop 58 is applied on line 66 to an input of master flip-flop 54. Outputs generated by master flip-flop 54 and slave flip-flop 58 are also generated on lines 70 and 74, respectively.

Clock oscillator 78 generates a clock signal on line 82 which is applied to an input of master flip-flop 54 and inverted, here by way of an inverting input 86 of slave flip-flop 58, and then applied to flip-flop 58.

Flip-flops 54 and 58 may, for example, and as illustrated, comprise D-type flip-flops in which the clock signal generated by clock oscillator 78 are applied to the clock and inverting clock input of the respective flip-flops 54 and 58. Flip-flop pairs comprised of other types of flip-flops may, of course, be alternately configured.

Additionally, latching comparators may be substituted for the flip-flops, particularly when a circuit is operated at high frequencies. As latching comparators may be configured to form the logical equivalents of flip-flops, flip-flop pair 50 may similarly represent latching comparators configured to perform the functions of flip-flops 54 and 58.

While the clock signal generated by clock oscillator 78 is supplied to each of the flip-flops 54 and 58, because the clock signal applied to slave flip-flop 58 is inverted, the flip-flops 54 and 58 are operative to read and latch the input supplied thereto on lines 66 and 62, respectively, at different (and nonconcurrent) time periods. That is to say, master flip-flop 54 "reads" the inverted signal generated by slave flip-flop 58 on line 66 at a first polarity of the clock signal (generated on line 82) while the slave flip-flop 58 "latches" at the first polarity of the clock signal. Conversely, at the second polarity of the clock signal, master flip-flop 54 "latches" and slave flip-flop 58 "reads" the signal applied thereto on line 62.

The signals generated on lines 70 and 74 at the outputs of flip-flops 54 and 58 are identical to one another but are offset in phase by amounts corresponding to the duty cycle of the clock signal applied to the respective flip-flops. When the clock signal generated by oscillator 78 and applied to flip-flops 54 and 58 is of exactly a 50—50 duty cycle, the signals generated on lines 70 and 74 are in a ninety degree, i.e., quadrature, phase relationship with one another.

Figure 2:
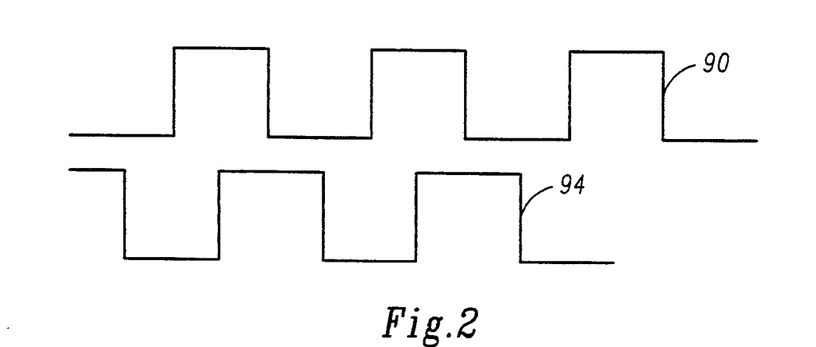
FIG. 2 is a graphical representation illustrating the relationship between the signals generated by the individual flip-flops of the flip-flop pair of FIG. 1.

FIG. 2 is a graphical representation of the relationship between the signals generated on lines 70 and 74, respectively, when the clock signal generated by clock oscillator 78 is of exactly a 50—50 duty cycle. Waveform 90 represents a signal generated on line 70 and waveform 94 is representative of a signal generated on line 74. Waveforms 90 and 94 are in exact phase quadrature with one another for so long as the clock signal applied to the flip-flops 54 and 58 is of a 50—50 duty cycle.

Accordingly, flip-flop pair 50 may be utilized as a quadrature generator when a clock oscillator which generates a clock signal of exactly a 50—50 duty cycle is available. However, as noted hereinabove, clock oscillators do not necessarily generate clock signals which are of exactly 50—50 duty cycles. When the clock signal applied to flip-flops 54 and 58 of flip-flop pair 50 is of a duty cycle other than the 50—50 duty cycle, the signals generated on lines 70 and 74 are not in phase quadrature with one another. Accordingly, in such instances, a quadrature generator formed of such flip-flop pair does not properly generate signals in perfect phase quadrature with one another.

Figure 3:
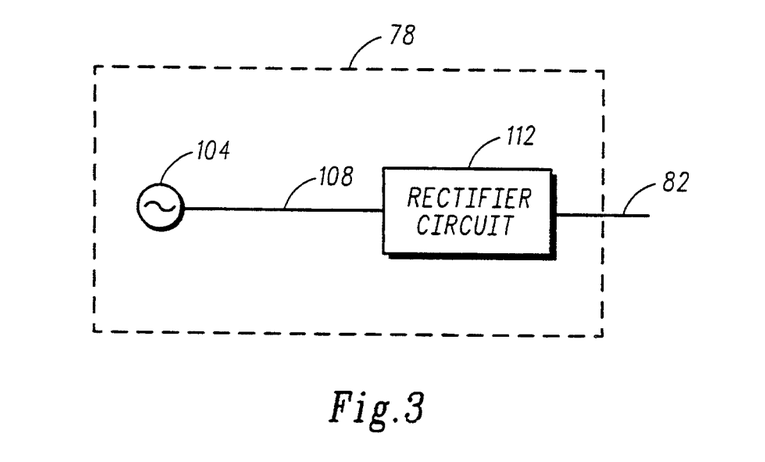
FIG. 3 is a partial block, partial circuit diagram of a clock oscillator which generates a clock signal for application to the flip-flop pair of FIG. 1.

FIG. 3 is a partial block, partial circuit diagram of clock oscillator 78, shown in FIG. 1, which generates the clock signal on line 82 for application to flip-flops 54 and 58. In the preferred embodiment, clock oscillator 78 includes phase-locked oscillator 104 which generates an oscillating signal on line 108 which is applied to rectifier circuit 112. Rectifier circuit 112 generates a rectified signal which forms the clock signal generated on line 82. The rectified signal forming the clock signal is of an oscillating frequency which is twice that of the frequency of oscillation of the signal generated on line 108 by oscillator 104. As the signals generated on lines 70 and 74 by flip-flops 54 and 58 are of frequencies of one half of the frequency of the clock signal applied to flip-flops 54 and 58, selection of an oscillator 104 of an oscillation frequency corresponding to the desired frequency of the signals generated on line 70 and 74 may be made when oscillator 78 includes rectifier circuit 112. Alternately, of course, the oscillating signal generated by oscillator 104 may be applied directly to the flip-flops 54 and 58 when the oscillator 104 is selected to be of a frequency twice that of the desired frequency of the signals generated on lines 70 and 74.

Figure 4:
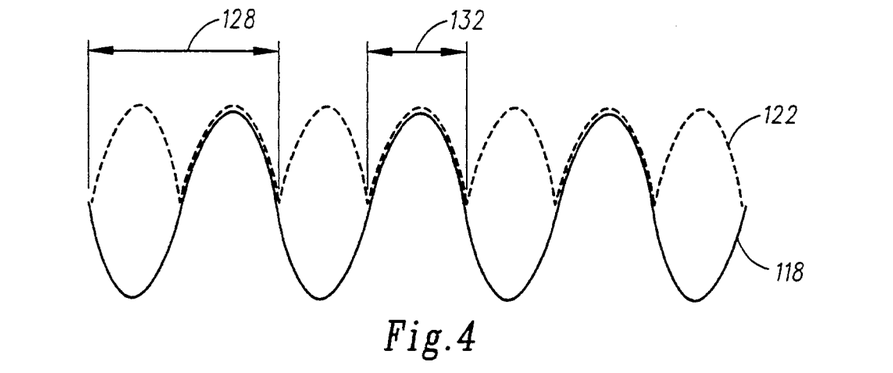
FIG. 4 is a graphical representation showing waveforms of an oscillating signal and of the oscillating signal once rectified, generated by the clock oscillator of FIGS. 1 and 3.

Waveform 118 shown in the graphical representation of FIG. 4 is representative of the oscillating signal generated by a crystal oscillator, such as oscillator 104 of FIG. 3. Waveform 122, defined to be comprised of positive-half portions of waveform 118 and of rectified portions of negative-half portions of waveform 118, shown in hatch in the figure, is further shown in the figure. Both waveforms 118 and 122 are periodic; waveform 118 is of a period of a length corresponding to line segment 128 and waveform 122 is of a period of a length corresponding to the length of line segment 132. Operation of rectifier circuit 112 to double the frequency of the signal generated by oscillator 104 is, hence, graphically shown.

Figure 5:
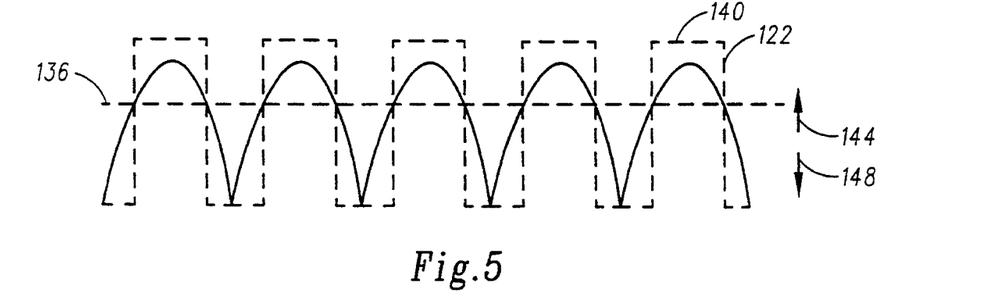
FIG. 5 is a graphical representation, similar to the rectified signal shown partially in hatch in FIG. 4 but further representing the relationship between signals generated by various elements of the preferred embodiments of the present invention.

A portion of waveform 122 is shown in enlarged form in FIG. 5. Horizontally-extending line segment 136 is positioned at a level corresponding to the average value of waveform 122. Hereinafter, portions of waveform 122 positioned above segment 136 shall be referred to as positive portions of the waveform, and portions of waveform 122 positioned below segment 136 shall be referred to as negative portions of the waveform. The duty cycle of a periodic waveform is defined to be the ratio of a pulse (i.e., the positive portion of the waveform) to a pulse period of the periodic waveform. Hence, the average value thereby also defines the duty cycle of the waveform.

Waveform 140, shown in hatch, is a pulse train having a duty cycle which corresponds to the duty cycle of waveform 122 and is of a high logic level when waveform 122 is of a value greater than the average value, indicated by line segment 136, and is of a low logic level when waveform 122 is of a value less than the average value.

Arrows 144 and 148 are further shown in the figure and represent directions in which line 136 may be translated, namely upwardly or downwardly, when alteration in the waveform configuration of waveform 122 causes the average value of the waveform to be altered. Hence, alteration of the relative location of line 136 used to define the duty cycle of waveform 122 and pulse train 140 alters the duty cycle of the waveform and pulse train. By increasing the level of line 136, the duty cycle of pulse train 140 is decreased and by lowering of line 136, the duty cycle of pulse train 140 and waveform 122 is increased.

Figure 6:
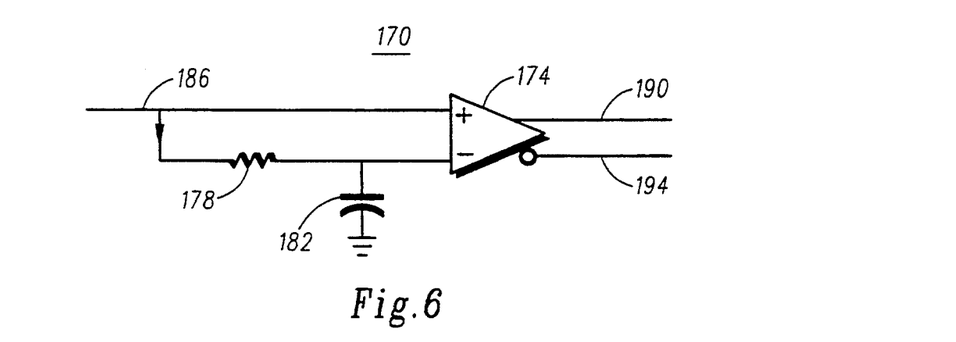
FIGS. 6 and 7 are circuit representations of comparator circuits which may be utilized to form one of the signals represented in the graphical representation of FIG. 5.
Figure 7:
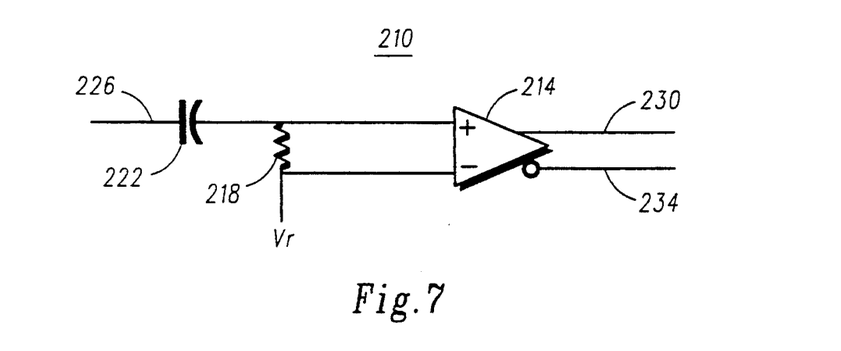

FIGS. 6 and 7 are circuit diagrams of comparator circuits utilized to generate pulse train 140 (shown in FIG. 5) responsive to application of waveform 122 (shown in FIGS. 4 and 5).

The comparator circuit of FIG. 6, referred to generally by reference numeral 170, is comprised of operational amplifier 174, resistor 178, and capacitor 182. Waveform 122 of FIG. 5 is applied directly to a positive input of amplifier 174 on line 186 and to the negative input of amplifier 174 by way of resistor 178. Shunt capacitor 182 is positioned between the negative input of amplifier 174 and ground. A pulse train corresponding to pulse train 140 of FIG. 5 is generated on line 190, and a pulse train, inverted to that of pulse train 140, is generated on line 194.

By altering the DC level of the negative input to amplifier 174 (independent of the actual average value of the signal applied to the positive input of amplifier 174), the duty cycle of the pulse train generated by amplifier 174 may be altered. Such alteration of the DC level may, of course, be effectuated by applying a small dc current, generated for example by a dc current source (not shown in the Figure) at the node including the negative input to amplifier 174. That is to say, although the duty cycle of the waveform 122 applied to amplifier 174 on line 186 may be of a duty cycle other than a 50—50 duty cycle, by proper alteration of the DC level of the signal applied to the negative input of amplifier 174, the duty cycle of the output signal generated on line 190 (and also on line 194) may be altered to be of a 50—50 duty cycle.

The comparator circuit of FIG. 7, referred to generally by reference numeral 210, is operative in a manner similar to that of comparator 170 of FIG. 6 to convert a waveform, such as waveform 122 into a pulse train, such as pulse train 140 of FIG. 5. Comparator 210 is again comprised of an operational amplifier, here amplifier 214, a resistor, here resistor 218, and a capacitor, here capacitor 222.

A waveform, such as waveform 122 of FIG. 5, is applied on line 226 to a positive input of amplifier 214 by way of capacitor 222, and to a negative input of Amplifier 214 by way of capacitor 222 and also resistor 218. Resistor 218 is coupled at a first side thereof to capacitor 222 and at a second side thereof to the negative input of amplifier 214 and also to a reference voltage $V_r$.

Again, amplifier 214 generates a pulse train on line 230, analogous to pulse train 140 of FIG. 5, of a duty cycle corresponding to the duty cycle of the signal supplied thereto on line 226. However, by proper alteration of the DC voltage at the positive input of amplifier 214, the duty cycle of the pulse train generated by amplifier 214 may be of a duty cycle which differs with that of the duty cycle of the signal applied thereto on line 226.

By altering the DC level of the positive input to amplifier 214 (independent of the actual value of the signal applied on line 226 and independent of the value of $V_r$), the duty cycle of the pulse train generated by amplifier 214 may be altered. Such alteration of the DC level may, of course, be effectuated by applying a small dc current, generated for example by a dc current source (not shown in the Figure) at the node including the positive input to amplifier 214. That is to say, although the duty cycle of the waveform 122 applied to comparator 210 on line 226 may be of a duty cycle other than a 50—50 duty cycle, by proper alteration of the DC level of the signal applied to the positive input of amplifier 214, the duty cycle of the output signal generated on line 230 (and also on line 234) may be altered to be of a 50—50 duty cycle.

Hence, comparator circuits operable in manners analogous to operation of comparator circuit 170 or 210 of FIGS. 6 and 7 can be utilized to form a portion of a quadrature generator to correct for clock signals generated by a clock oscillator having duty cycles of other than 50—50 duty cycles.

It should further be noted that, at high frequencies defined as frequencies at which the comparator gains are small, and with respect to comparators 170 and 210 of FIGS. 6 and 7, rather than altering the voltage levels of signals applied to the input nodes of amplifiers 174 and 214, respectively, DC components of double-ended output signals generated by the respective amplifiers may be modified.

Figure 8:
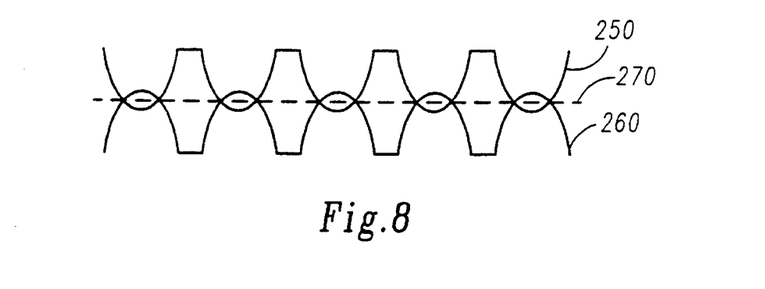
FIG. 8 is a graphical representation of signals generated during operation of the circuits shown in FIGS. 6 and 7.

FIG. 8 is a graphical representation of the positive and negative outputs of either amplifier 174 or amplifier 214 at high frequencies at which the comparator gains are small. Waveform 250 is representative of a negative output of the amplifier (taken from line 194 or line 234) and waveform 260 is representative of a positive output of the amplifiers (taken from line 190 or line 230). Horizontal line 270, shown in hatch, is drawn at the intersection of curves 250 and 260.

The differential output duty cycle is defined at horizontal line 270. By modifying the DC components of double-ended output signals of the amplifier, the positive and negative outputs being represented by waveforms 260 and 250, respectively, the duty cycle defined at horizontal line 270 can be modified.

While not shown, by additionally positioning a comparator to receive the signals generated by amplifiers 174 or 214, the symmetry of the positive and negative signal swings of FIG. 8 may be preserved, but the amplitude variation of the positive and negative swings of the waveforms will be reduced.

Figure 9:
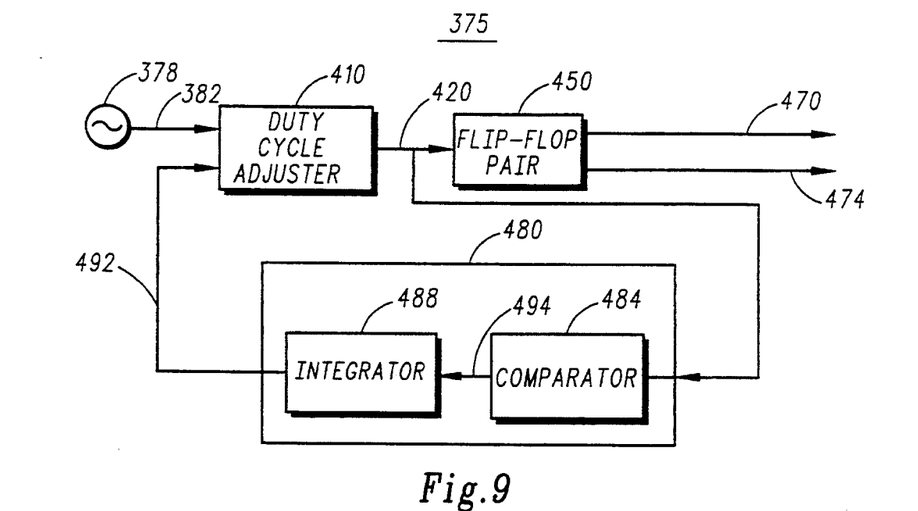
FIG. 9 is a logical block diagram of the circuit of a first preferred embodiment of the present invention.

Turning next to the block diagram of FIG. 9, a circuit, referred to generally by reference numeral 375, of a preferred embodiment of the present invention is shown. Circuit 375 forms a quadrature generator for generating a pair of periodic signals of similar frequencies, but in phase quadrature with one another.

Clock oscillator 378, analogous to dock oscillator 78 of preceding figures, generates a periodic clock signal on line 382. The clock signal, which as described previously with respect to clock oscillators generally, is of a duty cycle other than an exact 50—50 duty cycle. Line 382 is coupled to a first input of duty cycle adjuster 410. Duty cycle adjuster 410 includes comparator circuitry analogous to comparators 170 and 210 of FIGS. 6 and 7. Duty cycle adjuster 410 is operative to generate an oscillating signal of an oscillating signal duty cycle.

The oscillating signal generated on line 420 by duty cycle adjuster 410 is applied to flip-flop pair 450 configured in an arrangement corresponding to flip-flop pair 50 of FIG. 1. Flip-flop pair 450 forms a phase-offset signal generator which generates a pair of pulse trains (a first pulse train is generated on line 470 and a second pulse train is generated on line 474) which are in phase quadrature with one another.

Circuit 375 further includes a feedback control loop comprised of the elements contained within duty cycle detector block 480, here shown to include comparator 484 and integrator 488. An output of integrator 488 is coupled to a second input of duty cycle adjuster 410 by way of line 492. The feedback control loop is operative to cause alteration of the duty cycle of the oscillating signal generated by duty cycle adjuster 410 to cause the oscillating signal to be of a 50—50 duty cycle.

In operation, comparator 484, here coupled to receive the oscillating signal generated by duty cycle adjuster 410 on line 420, is operative to generate a signal which has the same zero crossing relationship, and hence duty cycle, as the oscillating signal applied thereto.

Comparator 484 generates a signal on line 494 which is applied to integrator 488.

Integrator circuit 488 which, in the preferred embodiment has a unity gain frequency much less than the signal frequency of the signal generated on line 494, integrates the signal applied thereto to form the average value of the signal generated by the comparator and thereby also to amplify the average value of the signal. (Integrator 488 also serves to increase the stability of the loop.) The signal generated by integrator 488 on line 492 forms a control signal which, when applied to adjuster 410, is operative to cause the trigger level of the comparator forming duty cycle adjuster 410 to cause the oscillating signal generated on line 420 to be of a 50—50 duty cycle. Once the oscillating signal generated on line 420 is of the 50—50 duty cycle, the feedback control loop is operative to maintain the duty cycle of the oscillating signal at such level.

By causing the oscillating signal generated on line 420 and applied to flip-flop pair 450 to be of an exact 50—50 duty cycle, the pulse trains generated on lines 470 and 474 are positioned in perfect phase quadrature with one another.

Figure 10:
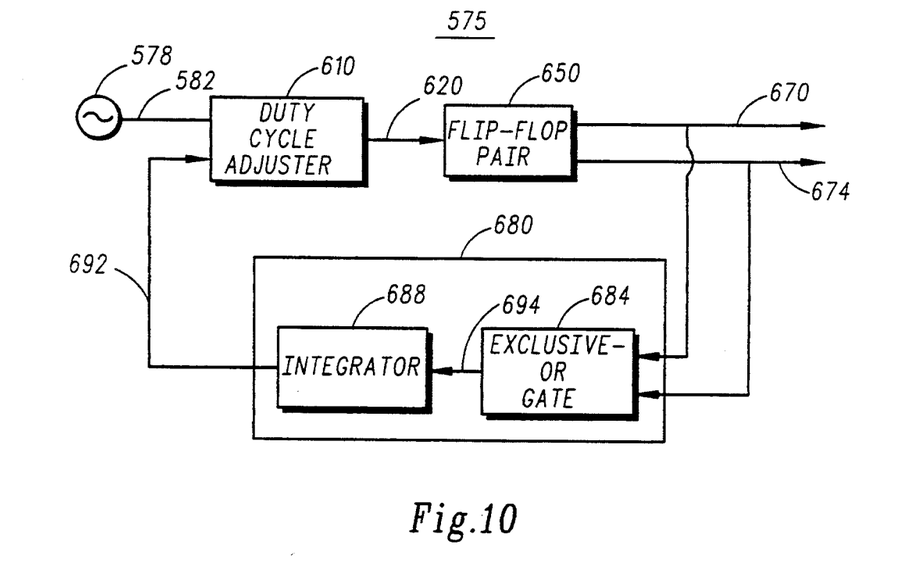
FIG. 10 is a block diagram of the circuit of an alternate, preferred embodiment of the present invention.

FIG. 10 is a block diagram of a circuit, referred to generally by reference numeral 575 forming a quadrature generator of an alternate, preferred embodiment of the present invention. Circuit 575 again includes a clock oscillator, here clock oscillator 578 which is again similar to the clock oscillators shown in the preceding figures.

Clock oscillator 578 generates a clock signal on line 582 which is applied to a first input of duty cycle adjuster 610. Duty cycle adjuster 610 is operative in a manner similar to that of duty cycle adjuster 410 of FIG. 9 and again includes a comparator circuit.

Duty cycle adjuster 610 generates an oscillating signal on line 620 which is applied to flip-flop pair 650. Flip-flop pair 650 is similar to flip-flop pair 450 of FIG. 9 and flip-flop pair 50 of FIG. 1. Flip-flop pair 650 is operative to generate a pair of pulse trains (a first pulse train is generated on line 670 and a second pulse train is generated on line 674) which are in phase quadrature with one another.

Circuit 575 again includes a feedback control loop comprised of the elements positioned within phase difference detector block 680. As illustrated, in the preferred embodiment, the feedback control loop is comprised of an exclusive-or logic gate 684 and integrator 688. An output of integrator 688 is coupled to a second input of duty cycle adjuster 610 by way of line 692. Exclusive-or logic gate 684 is coupled to receive directly the pulse train pair generated by flip-flop pair 650 on lines 670 and 674 at inputs of the gate 684.

Exclusive-or gate 684 generates a signal on line 694 which is the logical exclusive-or of the signals applied thereto. The signal generated on line 694 is applied to integrator 688. Because the pulse trains of the pulse train pair are out of phase with one another but are of similar frequencies, the exclusive-or-logic gate 684 also generates a periodic signal; however, the frequency of the periodic signal generated by gate 684 is of a frequency twice that of the frequency of the pulse trains generated on lines 670 and 674. The DC component of the periodic signal generated by gate 684 will be of a value other than zero when the pulse train pair is out of phase quadrature with one another, wherein zero is defined as the zero bias reference of the integrator 688.

Integrator 688, analogous to integrator 488 of FIG. 9, integrates the signal generated by logic gate 684 to form the average value of the signal and also to amplify the average value of the signal. Such signal is then applied to the second input of duty cycle adjuster 610 to alter the duty cycle of the oscillating signal generated thereat. The feedback control loop is thereby operative to position the pulse trains of the pulse train pair generated on line 670 and 674 in phase quadrature with one another and to maintain the pulse trains in phase quadrature.

Circuit 375 forming the quadrature generator of FIG. 9 differs with that of circuit 575 of FIG. 10 in the signals which are utilized by the respective feedback control loops. The phases of the pulse trains generated on lines 670 and 674 are directly utilized in the feedback loop of the quadrature generator formed of circuit 575, and, conversely, the relative phase differentials between the pulse trains generated by flip-flop pair 450 of circuit 375 are inferentially measured.

Figure 11:
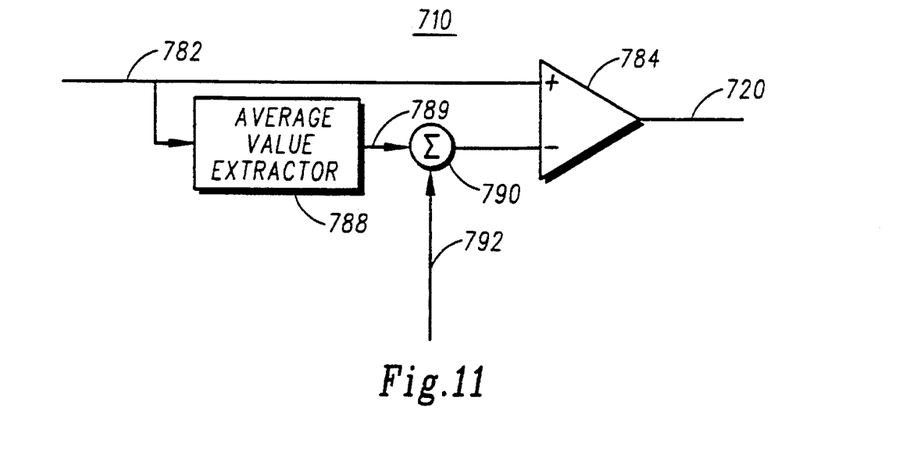
FIG. 11 is a circuit representation of a portion of the circuit of either of the preferred embodiments of the circuit of the present invention shown in FIGS. 9 and 10.

FIG. 11 is a partial circuit, partial block representation of duty cycle adjuster 710 which comprises duty cycle adjusters 410 and 610 of circuits 375 and 575 of FIGS. 9 and 10, respectively, in the preferred embodiments of the present invention. A clock signal is supplied on line 782 to a positive input of amplifier 784 and to an input of average value extractor 788. Average value extractor 788 calculates the average value of the signal applied thereto and generates a signal on line 789 which is applied to summing element 790. Summing element also receives a signal on line 792 representative of the feedback control signal. A summed signal generated by summing element 790 is applied to a negative input of amplifier 784. Amplifier 784 may alternately be drawn with a double-ended output instead of the single-ended output 720 in a manner analogous to amplifiers 174 and 214 of FIGS. 6 and 7, respectively.

Figure 12:
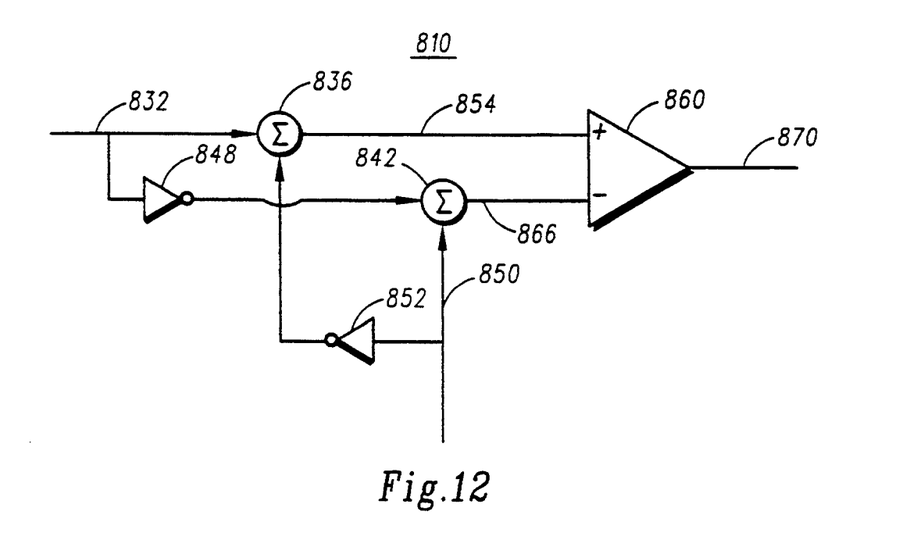
FIG. 12 is a circuit representation, analogous to that of FIG. 11 which may alternately form a portion of the circuit of either of the preferred embodiments of the circuit of the present invention shown in FIGS. 9 and 10.

FIG. 12 illustrates duty cycle adjuster 810 which may alternately comprise duty cycle adjuster 410 and duty cycle adjuster 610 of circuits 375 and 575 of FIGS. 9 and 10. Duty cycle adjuster 810 is a double-ended implementation of a duty cycle adjuster which has the advantage of not requiring the use of an average value extractor such as average value extractor 788 of FIG. 11. A clock signal is applied on line 832 to an input of summing element 836 and to summing element 842 by way of inverter 848. A feedback control signal generated by the feedback control loop of circuits 375 or 575 of FIGS. 9 or 10 is applied on line 850 to an input of summing element 842 and to summing element 836 by way of inverter 852. Summing element 836 sums the two signals applied thereto and generates a summed signal on line 854 which is applied to a positive input of amplifier 860. Summing element 842 generates a summed signal on line 866 which is applied to a negative input of amplifier 860. If signals applied on lines 832 and 850 are available as double-ended signals, then inverters 848 and 852 are not necessary for operation of the circuit. Amplifier 860 may alternately be drawn with a double-ended output instead of the single-ended output formed of line 870 in a manner analogous to amplifiers 174 and 214 of FIGS. 6 and 7, respectively.

Figure 13:
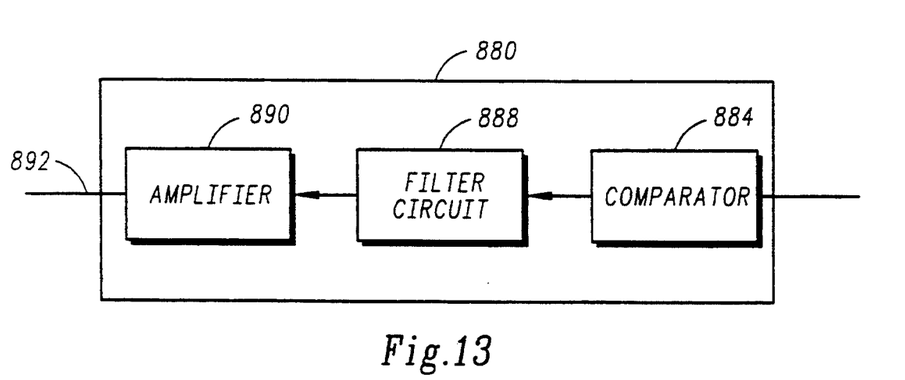
FIG. 13 is a block diagram of the circuit of a portion of yet another preferred embodiment of the present invention.

Turning now to the block diagram of FIG. 13, block 880 is shown of an alternate feedback control loop having elements which may be substituted for the elements encompassed by blocks 480 and 680 of circuits 375 and 575, respectively. Here, the feedback control loop is comprised of comparator 884 which is operative in a manner analogous to operation of comparator 484 of circuit 375 and filter circuit 888 which is substituted for integrator circuit 488 of circuit 375. Filter 888 is operative to generate a filtered signal which is applied to amplifier 890, here preferably a dc amplifier. Amplifier 890 generates an amplified signal on line 892 which is utilized as a control signal to control, and to alter, the duty cycle of an oscillating signal generated by a duty cycle adjuster, such as duty cycle adjuster 410 of circuit 375.

Figure 14:
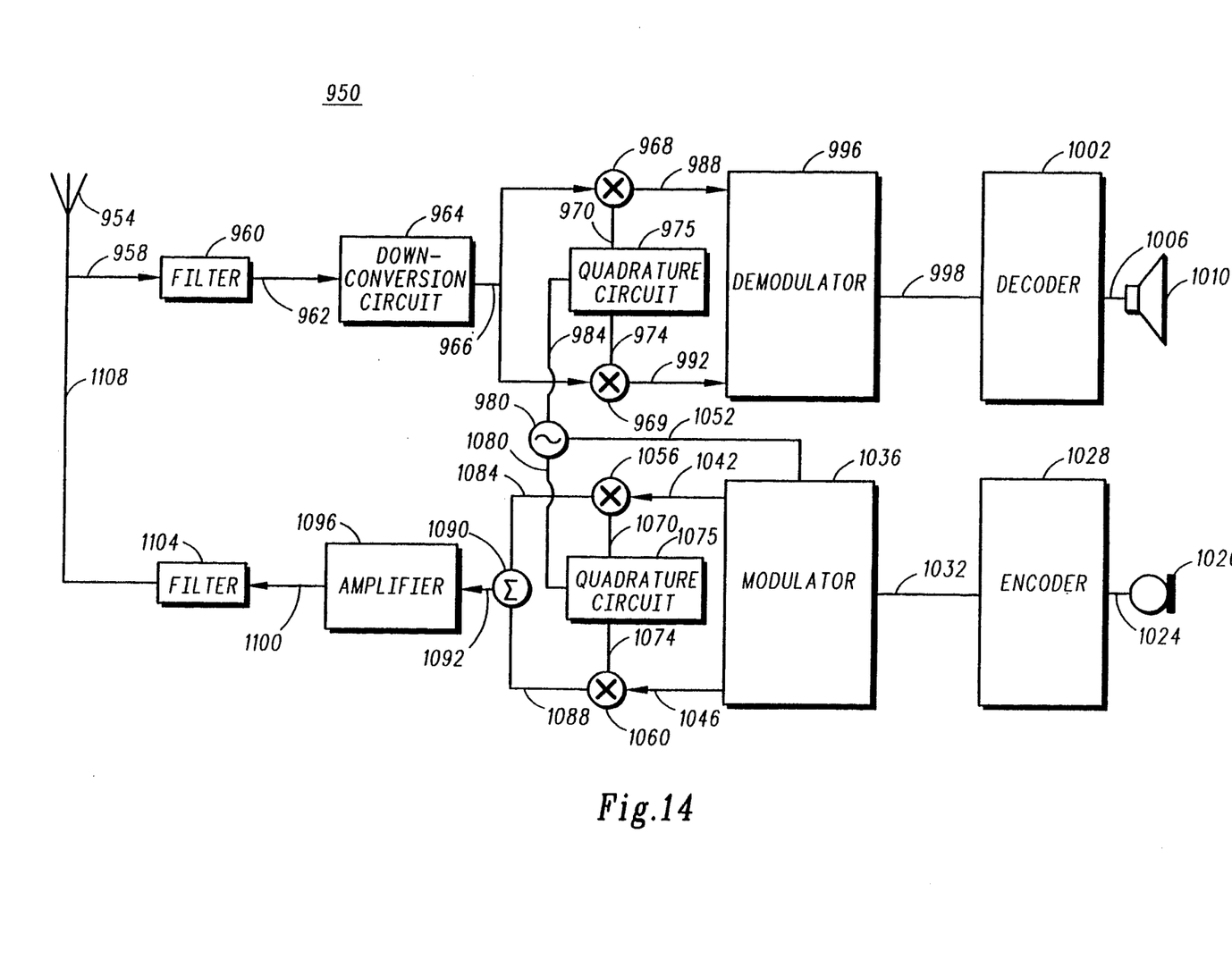
FIG. 14 is a partial block, partial circuit diagram of a radio transceiver of a preferred embodiment of the present invention in which the circuit of any of the preferred embodiments shown in the preceding figures forms a portion.

FIG. 14 is a block diagram of a radio transceiver, referred to generally by reference numeral 950, of a preferred embodiment of the present invention. Transceiver 950 includes circuitry analogous to circuits 375 or 575 shown in preceding Figures as portions thereof. The portion of transceiver 950 shown in the top portion of the Figure forms the receiver portion of the transceiver, and the portion of the transceiver shown in the bottom portion of the Figure forms the transmitter portion of the transceiver.

An electromagnetic signal transmitted to transceiver 950 is detected by antenna 954, converted into an electrical signal which is applied, by way of line 958, to filter 960. Filter 960 generates a filtered signal on line 962 which is coupled to down-conversion circuit 964.

Down-conversion circuit 964 generates a down-converted signal on line 966 which is applied to first inputs of mixer circuits 968 and 969.

Lines 970 and 974, extending from circuit 975, are coupled to second inputs of mixer circuits 968 and 969. Lines 970 and 974 correspond to lines 470 and 474 or lines 670 and 674 of circuits 375 or 575 of FIGS. 9 or 10. A clock oscillator contained within circuit 975 is coupled to reference oscillator 980, by way of line 984, to be maintained in a frequency relationship therewith. (That is to say, the clock oscillator contained within circuit 975 is a phase-locked oscillator.)

The signals generated by circuit 975 on lines 970 and 974 are in perfect phase quadrature with one another. Hence, mixed signals generated by mixer circuits 968 and 969 on lines 988 and 992 are also in phase quadrature with one another. The signals generated on lines 988 and 992 are sometimes referred to as the receive "I-" and "Q-" signals.

Lines 988 and 992 are coupled to demodulator 996 whereat the signals generated on lines 988 and 992 are demodulated. Demodulator 996 generates a demodulated signal on line 998 which is supplied to decoder 1002. Decoder 1002 generates a decoded signal on line 1006 which is supplied to a transducer, here speaker 1010.

The transmitter portion of transceiver 950 is operative to transmit a signal generated thereat and includes a transducer, here microphone 1020, for converting a voice signal into an electrical signal.

The electrical signal generated by microphone 1020 is supplied, by way of line 1024, to encoder 1028. Encoder 1028 encodes the signal supplied thereto and generates an encoded signal on line 1032.

Line 1032 is coupled to modulator 1036 which modulates the encoded signal supplied thereto and generates modulated signals on lines 1042 and 1046. Circuitry of modulator 1036 is maintained in a frequency relationship with reference oscillator 980 by connection therewith by way of line 1052. The modulated signals on lines 1042 and 1046 are maintained in a quadrature phase relationship to each other and are sometimes referred to as the transmit "I-" and "Q-" signals.

Lines 1042 and 1046 are coupled to first inputs of mixer circuits 1056 and 1060.

Lines 1070 and 1074, extending from circuit 1075, are coupled to second inputs of mixer circuits 1056 and 1060. Lines 1070 and 1074 correspond to lines 470 and 474 or lines 670 and 674 of circuits 375 or 575 of FIGS.

9 or 10. And, circuit 1075 corresponds to circuits 375 or 575 of FIGS. 9 or 10. A clock oscillator contained within circuit 1075 is coupled to reference oscillator 980, by way of line 1080, to be maintained in a frequency relationship therewith.

The signals generated by circuit 1075 on lines 1070 and 1074 are in perfect phase quadrature with one another. Hence, the mixed signal generated by mixer circuit 1056 on line 1084 has a pair of sidebands, each of which is at either 0° or 180° phase relationship relative to each sideband generated by mixer circuit 1060 on line 1088.

Lines 1084 and 1088 are coupled to summing element 1090 which serves to sum the signals applied thereto on lines 1084 and 1088.

The summed signal generated on line 1092 by element 1090 is coupled to amplifier 1096.

Amplifier 1096 generates an amplified signal on line 1100 which is applied to filter 1104, which, in turn, generates a filtered signal on line 1108. Line 1108 is coupled to antenna 954 whereat the signal generated by the transmitter portion of transceiver 950 is transmitted.

Figure 15:
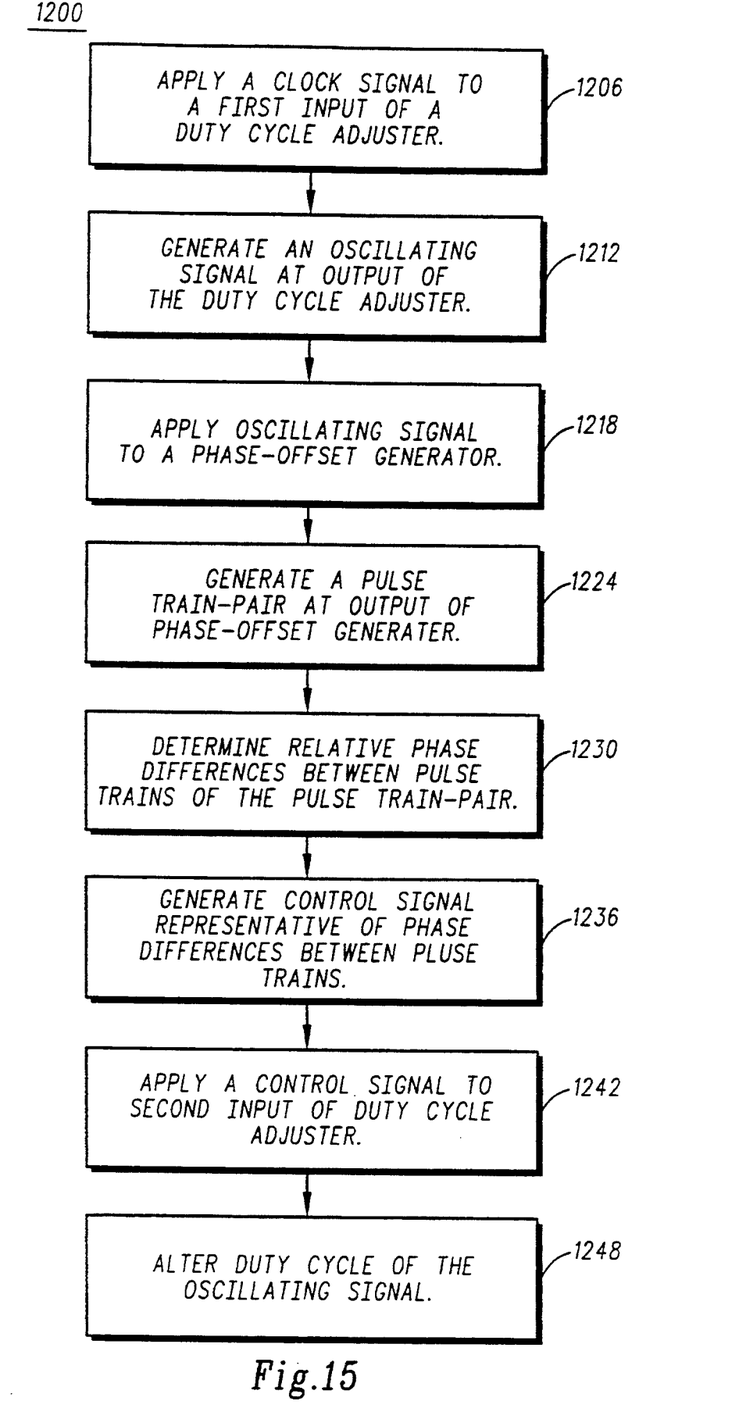
FIG. 15 is a logical flow diagram listing the method steps of a preferred embodiment of the present invention.

FIG. 15 is a flow diagram listing the method steps of the method, referred to generally by reference numeral 1200, of a preferred embodiment of the present invention. First, and as indicated by block 1206, a clock signal is applied to a first input of a duty cycle adjuster. Next, and as indicated by block 1212, an oscillating signal defined by an oscillating signal duty cycle is generated at an output of the duty cycle adjuster.

Then, and as indicated by block 1218, the oscillating signal is applied to a phase-offset signal generator. Next, and as indicated by block 1224, a pulse train-pair comprised of a first pulse train and a second pulse train is generated at outputs of the phase-offset signal generator wherein the first pulse train and the second pulse train are of similar frequencies but offset in phase relative to one another.

Next, and as indicated by block 1230, relative phase differences between phases of the first and second pulse trains are determined. Then, and as indicated by block 1236, a control signal representative of relative phase differences between the phases of the first and second pulse trains is generated. And, as indicated by block 1242, the control signal is applied to a second input of the duty cycle adjuster.

Finally, and as indicated by block 1248, the oscillating signal duty cycle of the oscillating signal generated by the duty cycle adjuster is altered when the first and second pulse trains are beyond phase quadrature with one another.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A circuit for generating a set of signals maintained in phase quadrature with one another responsive to application of a clock signal defined by a clock signal duty cycle thereto, said circuit comprising:

an oscillator circuit to generate an oscillating signal having an oscillating signal duty cycle, the oscillator circuit coupled to receive the clock signal and operative responsive to values thereof;

a pulse generator to generate a pulse train-pair comprised of a first pulse train and a second pulse train wherein the first pulse train and the second pulse train are at substantially the same frequency but offset in phase relative to one another, the generator coupled to receive the oscillating signal generated by the oscillator circuit; and a feedback control circuit coupled to receive signals representative of phases of the first and second pulse trains, respectively, and coupled to the oscillator circuit, the feedback control circuit having a phase determining circuit to determine relative phase differences between the phases of the first and second pulse trains and to generate a control signal representative of the relative phase differences between the first and second pulse trains for application to the oscillator circuit, wherein the oscillator circuit alters the duty cycle of the oscillating signal when the first and second pulse trains are beyond phase quadrature with one another, thereby to position and maintain the first and second pulse trains in phase quadrature with one another.

2. A circuit for generating a set of signals maintained in phase quadrature with one another, the circuit comprising:

a clock oscillator for generating a clock signal defined by a clock signal duty cycle;

a duty cycle adjuster having a first input and a second input wherein the first input is coupled to receive the clock signal, the duty cycle adjuster for generating an oscillating signal defined by an oscillating signal duty cycle;

a phase-offset signal generator coupled to receive the oscillating signal generated by the duty cycle adjuster, the phase-offset signal generator for generating a pulse train-pair comprised of a first pulse train and a second pulse train wherein the first pulse train and the second pulse train are at substantially the same frequency but offset in phase relative to one another; and a feedback detector coupled to receive signals representative of phases of the first and second pulse trains, respectively, the feedback detector for determining relative phase differences between the phases of the first and second pulse trains and for generating a control signal representative of the relative phase differences for application to the second input of the duty cycle adjuster, the duty cycle adjuster responsive to the control signal representative of the relative phase difference to alter the duty cycle of the oscillating signal when the first and second pulse trains are beyond phase quadrature with one another, the feedback detector thereby forming a feedback control loop to position and maintain first and second pulse trains in phase quadrature with one another.

3. The circuit of claim 2 wherein the clock oscillator comprises a phase-locked oscillator of a desired oscillation frequency.

4. The circuit of claim 3 wherein the clock oscillator further comprises a frequency doubler coupled to the phase-locked oscillator, the frequency doubler for generating an output signal comprising the clock signal of a frequency twice the oscillation frequency.

5. The circuit of claim 2 wherein the duty cycle adjuster comprises a comparator circuit defining a threshold level alterable responsive to values of the control signal generated by the feedback detector, the comparator circuit for generating an output signal of a first level when the clock signal is of a value above the threshold level and of a second level when the clock signal is of a value below the threshold level, the output signal formed thereby forming the oscillating signal defined by the oscillating signal duty cycle, whereby values of the threshold level defined by the comparator circuit are determinative of the oscillating signal duty cycle.

6. The circuit of claim 5 further comprising an average value detector coupled to receive the clock signal generated by the clock oscillator, the average value detector for determining the average value of the clock signal and for generating a signal indicative of the average value determined thereat, and an altering circuit for altering the signal indicative of the average value of the clock signal responsive to values of the control signal generated by the feedback-loop detector thereby forming an altered, average-value signal for application to the second input of the duty cycle adjuster.

7. The circuit of claim 5 further comprising an altering circuit for altering the clock signal responsive to values of the control signal generated by the feedback-loop detector thereby forming an altered clock signal for application to the first input of the duty cycle adjuster.

8. The circuit of claim 7 further comprising an inverter coupled to receive the clock signal generated by the clock oscillator, the inverter for inverting the clock signal to form an inverted clock signal thereby, and means for altering the inverted clock signal responsive to values of the control signal thereby forming an altered, inverted clock signal for application to the second input of the duty cycle adjuster.

9. The circuit of claim 2 wherein the phase-offset signal generator is comprised of a pair of flip-flops wherein an output line of a first flip-flop of the pair of flip-flops is coupled to an input of a second flip-flop of the pair of flip-flops and an output line of the second flip-flop is coupled to an input of the first flip-flop, and wherein the oscillating signal generated by the duty cycle adjuster is supplied to a clock input of the first flip-flop and to an inverted clock input of the second flip-flop, whereby signals generated upon the output lines of the first and second flip-flops, respectively, are offset in phase relative to one another by phase differences corresponding to values of the oscillating signal duty cycle of the oscillating signal.

10. The circuit of claim 2 wherein the feedback detector is coupled to receive the oscillating signal generated by the duty cycle adjuster.

11. The circuit of claim 10 wherein the feedback detector comprises a comparator circuit coupled to receive the oscillating signal generated by the duty cycle adjuster and operative to generate an output signal of a first level when the oscillating signal is above a threshold level of the comparator circuit and of a second level when the oscillating signal is of a value below the threshold level of the comparator circuit.

12. The circuit of claim 11 wherein the feedback detector further comprises an integrator circuit coupled to receive the output signal generated by the comparator circuit, the integrator circuit for determining an average value of the output signal supplied thereto and for generating a signal comprising the control signal representative of the average value determined thereat for application to the second input of the duty cycle adjuster.

13. The circuit of claim 11 wherein the feedback detector further comprises a filter circuit coupled to receive the output signal generated by the comparator circuit, the filter circuit for generating a filtered signal, and an amplifier coupled to receive the filtered signal generated by the filter circuit, the amplifier for amplifying the filtered signal to form an amplified signal thereby, the amplified signal comprising the control signal for application to the second input of the duty cycle adjuster.

14. The circuit of claim 2 wherein said feedback detector is coupled to receive the first pulse train and the second pulse train of the pulse train-pair generated by the phase-offset signal generator.

15. A circuit for generating a set of signals maintained in phase quadrature with one another, the circuit comprising:
a clock oscillator for generating a clock signal defined by a clock signal duty cycle;
a duty cycle adjuster having a first input and a second input wherein the first input is coupled to receive the clock signal at the first input thereof, the duty cycle adjuster for generating an oscillating signal defined by an oscillating signal duty cycle;
a phase-offset signal generator coupled to receive the oscillating signal generated by the duty cycle adjuster, the phase-offset signal generator for generating a pulse train-pair comprised of a first pulse train and a second pulse train wherein the first pulse train and the second pulse train are at substantially the same frequency but offset in phase relative to one another; and
a feedback detector coupled to receive signals representative of phases of the first and second pulse trains, respectively, the feedback detector for determining relative phase differences between the phases of the first and second pulse trains and for generating a control signal representative of the relative phase differences for application to the second input of the duty cycle adjuster, the duty cycle adjuster responsive to the control signal representative of the relative phase difference to alter the duty cycle of the oscillating signal when the first and second pulse trains are beyond phase quadrature with one another, the feedback detector thereby forming a feedback control loop to position and maintain first and second pulse trains in phase quadrature with one another;
wherein the feedback detector is coupled to receive the first pulse train and the second pulse train of the pulse train-pair generated by the phase-offset signal generator; and
wherein the feedback detector comprises an exclusive-or logic gate having a first input and a second input wherein the first pulse train is applied to the first input of the exclusive-or logic gate and wherein the second pulse train is applied to the second input of the exclusive-or logic gate.

16. The circuit of claim 15 wherein the feedback detector further comprises an integrator circuit coupled to an output of the exclusive-or logic gate, the integrator circuit for determining an average value of a signal generated at the output of the exclusive-or logic gate and for generating a signal comprising the control signal for application to the second input of the duty cycle adjuster.

17. A method for converting a clock signal generated by a clock oscillator into a set of signals maintained in phase quadrature with one another, said method comprising the steps of:

applying the clock signal to a first input of a duty cycle adjuster;

generating an oscillating signal defined by an oscillating signal duty cycle at an output of the duty cycle adjuster;

applying the oscillating signal generated during the step of generating the oscillating signal to a phase-offset signal generator;

generating a pulse train-pair comprised of a first pulse train and a second pulse train at outputs of the phase-offset signal generator wherein the first pulse train and the second pulse train are of similar frequencies but offset in phase relative to one another;

determining relative phase differences between phases of the first and second pulse trains generated during the step of generating the pulse train pair;

generating a control signal representative of relative phase differences between the phases of the first and second pulse trains;

applying the control signal generated during said step of generating the control signal to a second input of the duty cycle adjuster; and altering the oscillating signal duty cycle of the oscillating signal generated by the duty cycle adjuster when the first and second pulse trains are beyond phase quadrature with one another, thereby to position and maintain the first and second pulse trains in phase quadrature with one another.

18. In a receiver operative to receive a modulated signal transmitted thereto and having frequency conversion circuitry for down-converting the modulated signal into a down-converted signal, a combination with the frequency conversion circuitry of a quadrature mixer for converting the down-converted signal into a pair of signals in phase quadrature with one another, the quadrature mixer comprising:

a clock oscillator for generating a clock signal defined by a clock signal duty cycle;

a duty cycle adjuster having a first input and a second input wherein the first input is coupled to receive the clock signal at the first input thereof, the duty cycle adjuster for generating an oscillating signal defined by an oscillating signal duty cycle;

a phase-offset signal generator coupled to receive the oscillating signal generated by the duty cycle adjuster, the phase-offset signal generator for generating a pulse train-pair comprised of a first pulse train and a second pulse train wherein the first pulse train and the second pulse train are of similar frequencies but offset in phase relative to one another;

a feedback detector coupled to receive a signal representative of phases of the first and second pulse trains, respectively, the feedback detector for determining relative phase differences between the phases of the first and second pulse trains and for generating a control signal representative of the relative phase differences for application to the second input of the duty cycle adjuster whereat the duty cycle adjuster alters the oscillating signal duty cycle of the oscillating signal when the first and second pulse trains are beyond phase quadrature with one another, the feedback detector thereby forming a feedback control loop to position and maintain first and second pulse trains in phase quadrature with one another;

a first mixer coupled to receive the down-converted signal and the first pulse train, the first mixer for generating a first mixed signal formed of the down-converted signal and the first pulse train; and a second mixer coupled to receive the down-converted signal and the second pulse train, the second mixer for generating a second mixed signal formed of the down-converted signal and the second pulse train whereby the second mixed signal is in phase quadrature with the first mixed signal.

19. The combination in the receiver of claim 18 wherein the feedback detector is coupled to receive the oscillating signal generated by the duty cycle adjuster.

20. The combination in the receiver of claim 18 wherein the feedback-loop detector is coupled to receive the pulse train-pair comprised of the first pulse train and the second pulse train generated by the phase-offset signal generator.

21. In a transmitter operative to transmit a communication signal and having modulation circuitry for modulating the communication signal to form first and second modulated signals, a combination with the modulation circuitry of a quadrature mixer for converting the first and second modulated signals into first and second up-converted signals, respectively, said quadrature mixer comprising:

a clock oscillator for generating a clock signal defined by a clock signal duty cycle;

a duty cycle adjuster having a first input and a second input wherein the first input is coupled to receive the clock signal at the first input thereof, the duty cycle adjuster for generating an oscillating signal defined by an oscillating signal duty cycle;

a phase-offset signal generator coupled to receive the oscillating signal generated by the duty cycle adjuster, the phase-offset signal generator for generating a pulse train-pair comprised of a first pulse train and a second pulse train wherein the first pulse train and the second pulse train are of similar frequencies but offset in phase relative to one another;

a feedback detector coupled to receive a signal representative of phases of the first and second pulse trains, respectively, the feedback detector for determining relative phase differences between the phases of the first and second pulse trains and for generating a control signal representative of the relative phase differences for application to the second input of the duty cycle adjuster whereat the duty cycle adjuster alters the oscillating signal duty cycle of the oscillating signal when the first and second pulse trains are beyond phase quadrature with one another, the feedback detector thereby forming a feedback control loop to position and maintain first and second pulse trains in phase quadrature with one another;

a first mixer coupled to receive the first modulated signal and the first pulse train, the first mixer for generating a first mixed signal comprising the first up-converted signal formed of the first modulated signal and the first pulse train; and a second mixer coupled to receive the second modulated signal and the second pulse train, the second mixer for generating a second mixed signal comprising the second up-converted signal formed of the modulated signal and the second pulse train.

* * * * *

UNITED STATES PATENT AND TRADEMARK OFFICE
CERTIFICATE OF CORRECTION

PATENT NO. : 5,375,258
DATED : December 20, 1994
INVENTOR(S) : Gillig, Steven F.

It is certified that error appears in the above-identified patent and that said Letters Patent is hereby corrected as shown below:

On the title page of the patent, in the 1st line of the Abstract, please replace "quadrant" with --quadrature--.

On the title page of the patent, in the 2nd line of the Abstract, please replace "quadrant" with --quadrature--.

Signed and Sealed this

Sixth Day of June, 1995

*Attest:*

BRUCE LEHMAN

*Attesting Officer*     *Commissioner of Patents and Trademarks*